(12) United States Patent
Downey

(10) Patent No.: US 6,878,415 B2
(45) Date of Patent: Apr. 12, 2005

(54) METHODS FOR CHEMICAL FORMATION OF THIN FILM LAYERS USING SHORT-TIME THERMAL PROCESSES

(75) Inventor: Daniel F. Downey, Magnolia, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 149 days.

(21) Appl. No.: 10/122,823

(22) Filed: Apr. 15, 2002

(65) Prior Publication Data

US 2003/0194509 A1 Oct. 16, 2003

(51) Int. Cl.$^7$ .............................................. C23C 16/34
(52) U.S. Cl. .................... 427/527; 427/569; 427/553; 427/554; 427/255.37; 427/255.394; 438/769; 438/770; 438/778; 438/783
(58) Field of Search .................. 438/769, 770, 438/778, 783; 427/527, 569, 553, 554, 255.37, 255.394

(56) References Cited

U.S. PATENT DOCUMENTS

| | | |
|---|---|---|
| 4,623,912 A | 11/1986 | Chang et al. |
| 4,704,302 A | 11/1987 | Bruel et al. |
| 4,764,394 A | 8/1988 | Conrad |
| 5,019,752 A | 5/1991 | Schumacher |
| 5,212,425 A | 5/1993 | Goebel et al. |
| 5,218,179 A | 6/1993 | Matossian et al. |
| 5,329,205 A | 7/1994 | Goebel et al. |
| 5,330,800 A | 7/1994 | Schumacher et al. |
| 5,354,381 A | 10/1994 | Sheng |
| 5,464,783 A | 11/1995 | Kim et al. |
| 5,516,707 A | 5/1996 | Loh et al. |
| 5,711,812 A | 1/1998 | Chapek et al. |
| 5,897,363 A | 4/1999 | Gonzalez et al. |
| 5,930,606 A | 7/1999 | McCulloch |
| 6,013,566 A | 1/2000 | Thakur et al. |
| 6,069,063 A | 5/2000 | Chang et al. |
| 6,127,238 A | 10/2000 | Liao et al. |
| 6,136,654 A | 10/2000 | Kraft et al. |
| 6,168,980 B1 | 1/2001 | Yamazaki et al. |

FOREIGN PATENT DOCUMENTS

WO    WO 01/71787 A1 * 9/2001

OTHER PUBLICATIONS

Ito et al., Extended Abstracts of the 2001 International Conference on Solid State Devices and Materials, Tokyo, 2001, pp. 182–183.*
Huff et al., Electrochemical Society Proceedings, vol. 2001–2, 2001, pp. 223–241.*
Huff et al., "The Gate Stack/Shallow Junction Challenge for Sub–100 nm Technology Generations" Electrochemical Society Proceedings; 2001–2, pp. 223–241.
Iwai and Ohmi, "ULSI Process Integration for 2005 and beyond", Electrochemical Society Proceedings; 2001–2, pp. 3–33.
Ito et al., "Flash Lamp Anneal Technology for Effectively Activating Ion Implanted Si", Int'l Conf. on Solid State Devices and Materials; Tokyo, (2001) pp. 182–183.
"Difficult Challenges—The Front End Processes Grand Challenge", The International Technology Roadmap for Semiconductors: 2001, pp. 2–5 and 19–29.

* cited by examiner

Primary Examiner—Timothy Meeks

(57) ABSTRACT

A method is provided for forming a thin film layer of a substrate. The method includes the steps of forming a thin surface layer containing a dopant material on the substrate, and short-time thermal processing of the doped surface layer with processing parameters selected to produce a reaction between the surface layer and the dopant material to form a dielectric film, a metal film or a silicide film. In one embodiment, short-time thermal processing is implemented by flash rapid thermal processing of the doped surface layer. In another embodiment, short-time thermal processing is implemented by sub-melt laser processing of the doped surface layer. The process may be used for forming dielectric layers having a thickness of 50 angstroms or less.

31 Claims, 4 Drawing Sheets

ND FILM LAYERS USING SHORT-
METHODS FOR CHEMICAL FORMATION OF THIN FILM LAYERS USING SHORT-TIME THERMAL PROCESSES

FIELD OF THE INVENTION

This invention relates to methods for forming thin film layers on substrates, such as semiconductor wafers, and, more particularly, to methods for chemical formation of thin film layers using short-time thermal processes, such as flash RTP (rapid thermal processing) and sub-melt laser processing. The invention is particularly useful for forming dielectric layers having a thickness of 50 angstroms or less, but is not limited to this application.

BACKGROUND OF THE INVENTION

A well-known trend in the semiconductor industry is toward smaller, higher speed devices. In particular, both the lateral dimensions and the depths of features in semiconductor devices are decreasing. State of the art semiconductor devices require junction depths less than 1,000 angstroms and may eventually require junction depths on the order of 200 angstroms or less.

One critical element in the trend toward increased miniaturization is the gate structure of MOS transistors. A dielectric layer overlays the channel, and the gate electrode is disposed on the dielectric layer. Prior art devices have typically utilized a silicon dioxide gate dielectric.

As device dimensions decrease and operating speeds increase, the thickness of the gate dielectric must be reduced. However, below a thickness of about 1.5 nanometers, processing difficulties are encountered and leakage current may be unacceptable. One proposed solution to this problem involves the formation of dielectric layers having higher dielectric constants. For example, silicon nitride and silicon oxynitride dielectric layers have been utilized, and zirconium and hafnium oxide dielectric layers have been proposed. See for example, Hiroshi Iwai et al, "ULSI Process Integration for 2005 and beyond", Electrochemical Society Proceedings Volume 2001-2, pages 3–33 and Howard R. Huff et al, "The Gate Stack/Shallow Junction Challenge for Sub-100 nm Technology Generations", Electrochemical Society Proceedings Volume 2001-2, pages 223–241.

Techniques for forming silicon nitride or silicon oxynitride films have included chemical vapor deposition (CVD), remote plasma enhanced chemical vapor deposition (RPECVD), low pressure rapid thermal chemical vapor deposition (RTCVD), jet vapor deposition (JVD), in situ steam generation (ISSG) with remote plasma nitridation (RPN), and reoxidation of silicon nitride in a vertical high pressure (PHP) furnace. In each of these techniques, heating is required to diffuse the nitrogen to the desired depth and to promote a chemical reaction between the nitrogen and the silicon dioxide. However, the required heating may cause diffusion of the nitrogen beyond the thin dielectric layer and may cause undesired diffusion of other doped materials in the device being fabricated.

According, there is a need for improved methods for forming ultra thin dielectric layers and metallic layers.

SUMMARY OF THE INVENTION

According to a first aspect of the invention, a method is provided for forming a thin film layer on a substrate. The method comprises the steps of forming a thin surface layer containing a dopant material on the substrate, and short-time thermal processing of the doped surface layer with processing parameters selected to produce a reaction between the surface layer and the dopant material to form a dielectric film, a metal film, or a silicide film having a thickness of 50 angstroms or less.

In some embodiments, the step of forming a thin surface layer comprises plasma doping of the thin surface layer with low energy ions of the dopant material. In other embodiments, the step of forming a thin surface layer comprises ion implantation of the thin surface layer with low energy ions of the dopant material. In further embodiments, the step of forming a thin surface layer comprises chemical vapor deposition of the thin surface layer and the dopant material.

The thin surface layer may be doped with nitrogen, hafnium, zirconium, and combinations thereof. The thin surface layer may comprise a silicon oxide film. In some embodiments, the step of forming the thin surface layer comprises forming a thin silicon oxide layer that is doped with nitrogen.

The thin surface layer may have a thickness of 50 angstroms or less. In some embodiments, the thin surface layer has a thickness of 30 angstroms or less. In other embodiments, the thin surface layer has a thickness of 20 angstroms or less.

In some embodiments, the step of short-time thermal processing comprises flash rapid thermal processing of the doped surface layer. The flash rapid thermal processing may comprise rapid heating of the substrate to an intermediate temperature and flash heating of the doped surface layer to a final temperature that is higher than the intermediate temperature. In other embodiments, the step of short-time thermal processing may comprise sub-melt laser processing of the doped surface layer.

In a preferred embodiment, the reaction between the surface layer and the dopant material forms a dielectric layer having a high dielectric constant.

According to another aspect of the invention, a method is provided for forming a thin film layer on a silicon substrate. The method comprises the steps of forming on the silicon substrate a doped silicon oxide layer containing nitrogen, and short-time thermal processing of the doped silicon oxide layer with parameters selected to produce a reaction between the silicon oxide and the nitrogen to form silicon nitride, silicon oxynitride, or both, and to avoid significant diffusion of nitrogen into the substrate.

BRIEF DESCRIPTION OF THE DRAWINGS

For better understanding the present invention, reference is made to the accompanying drawings, which are incorporated herein by reference and in which.

DETAILED DESCRIPTION

Figure 1:
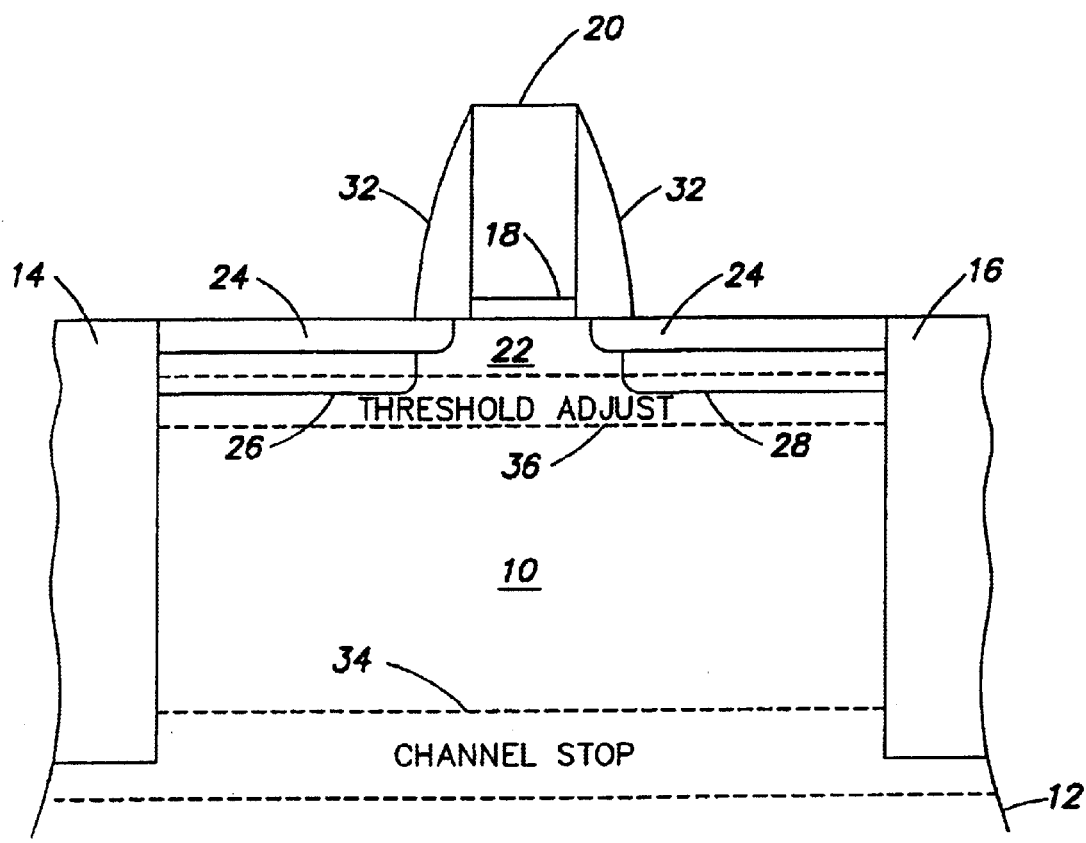
FIG. 1 is a simplified cross-sectional diagram of a typical MOS transistor.

An enlarged cross-sectional view of an example of an MOS device is shown in FIG. 1. It will be understood that FIG. 1 is simplified and is not drawn to scale. A well 10 (p-well or n-well) is formed in a silicon substrate 12 between isolation regions 14 and 16. A gate electrode 20 is formed over a channel 22. Gate electrode 20 is electrically isolated from channel 22 by a gate dielectric layer 18. Relatively shallow source/drain extensions 24 extend from opposite ends of channel 22 to relatively deep source and drain regions 26 and 28, respectively. A sidewall spacer 32 on the sides of gate electrode 20 facilitates implantation of source and drain regions 26 and 28. The MOS device may further include a channel stop 34 and a threshold adjust 36. A typical CMOS integrated circuit formed on substrate 12 includes multiple n-type MOS devices and multiple p-type MOS devices in a CMOS configuration, as known in the art.

As noted above, devices with reduced dimensions and increased operating speeds require that dielectric layer 18 be extremely thin and may require that the dielectric layer have a high dielectric constant. Prior art techniques for forming dielectric layers are not satisfactory for forming ultra thin layers. Such layers may be required to have thicknesses of 50 angstroms or less.

According to an aspect of the invention, a method is provided for forming a thin film layer on a substrate. The method includes the steps of forming a thin surface layer containing a dopant material on the substrate, and short-time thermal processing of the doped surface layer with parameters selected to produce a reaction between the surface layer and the dopant material. The thin surface layer containing a dopant material may be formed by a variety of techniques. For example, a thin film may be deposited or grown on the substrate, and the thin film may be doped by plasma doping with a plasma doping system or by ion implantation with a beamline ion implanter. In other embodiments, the doped surface layer may be formed by chemical vapor deposition or other known deposition techniques. The short-time thermal processing of the doped surface layer may be performed by flash rapid thermal processing (RTP) or by sub-melt laser processing, for example. The parameters of the short-time thermal processing step are selected to produce a desired reaction between the surface layer and the dopant material, while avoiding significant diffusion of the dopant material from the surface layer into the substrate.

The thin film layer which results from the process of the invention may be a dielectric layer, a doped metal layer or a doped silicide layer. The thin film layer has a thickness of 50 angstroms or less. In some embodiments, the thin film layer has a thickness of 30 angstroms or less, and in other embodiments, the thin film layer has a thickness of 20 angstroms or less.

A variety of surface layer materials and dopant materials may be utilized. By way of example, the surface layer may be a silicon oxide film, a metal film or a silicide film. Also, by way of example, the dopant material may be nitrogen, hafnium or zirconium. Combinations of these dopant materials may also be utilized. In one specific example, a silicon oxide layer is doped with nitrogen ions to form a dielectric layer of silicon nitride, silicon oxynitride, or both.

The doped surface layer may be formed by a variety of techniques. In one approach, a thin film of 50 angstroms or less is deposited or grown on the substrate. Then, a dopant material is implanted into the thin film by plasma doping or beamline ion implantation. In one example, an oxide film is grown on the substrate, and nitrogen is implanted into the oxide film by plasma doping. In another approach, the doped surface layer is formed by chemical vapor deposition. Other suitable methods for forming the doped surface layer include remote plasma enhanced chemical vapor deposition (RPECVD), low pressure rapid thermal chemical vapor deposition (RTCVD), jet vapor deposition (JVD), in situ steam generation (ISSG) with remote plasma nitridation (RPN), and reoxidation of silicon nitride in a vertical high pressure (PHP) furnace.

Figure 2:
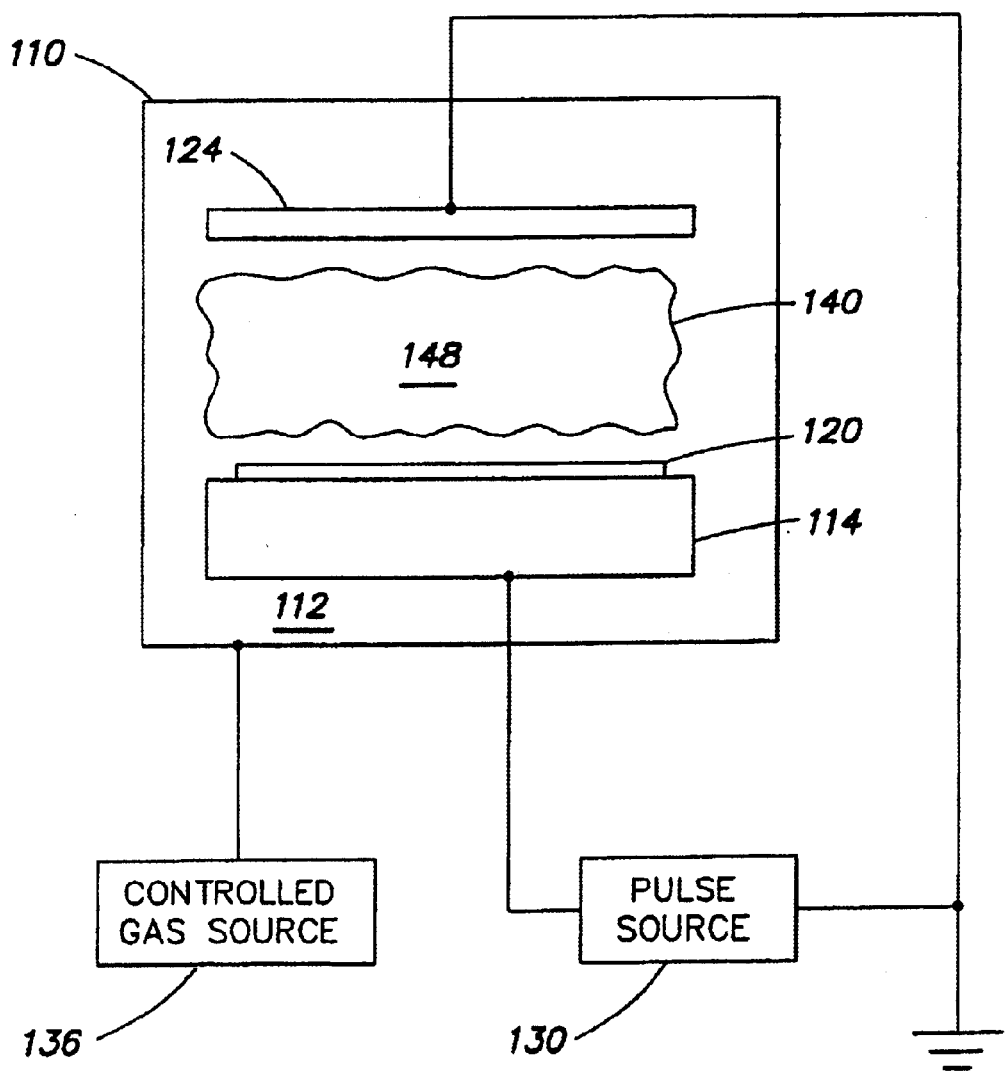
FIG. 2 is a schematic diagram of a plasma doping system.

An example of a plasma doping system suitable for practicing the present invention is shown schematically in FIG. 2. A plasma doping chamber 110 defines an enclosed volume 112. A platen 114 positioned within chamber 110 provides a surface for holding a workpiece, such as a semiconductor wafer 120. The wafer 120 may, for example, be clamped at its periphery to a flat surface of platen 114. In one embodiment, the platen has an electrically conductive surface for supporting wafer 120. In another embodiment, the platen includes conductive pins (not shown) for connection to wafer 120. In a further embodiment, the platen includes an electrostatic wafer clamp.

An anode 124 is positioned within chamber 110 in spaced relation to platen 114. The anode is typically connected to electrically conductive walls of chamber 110, both of which may be connected to ground. In another embodiment, platen 114 is connected to ground, and anode 124 is pulsed.

The wafer 120 (via platen 114) and the anode 124 are connected to a pulse source 130, so that wafer 120 functions as a cathode. The pulse source 130 typically provides pulses in a range of about 100 to 5,000 volts in amplitude, about 1 to 50 microseconds in duration and a pulse repetition rate of about 100 Hz to 2 kHz. It will be understood that these pulse parameter values are given by way of example only and that other values may be utilized within the scope of the invention.

A controlled gas source 136 is coupled to chamber 110. Gas source 136 supplies an ionizable process gas containing a desired dopant for implantation into the workpiece. Examples of ionizable process gases include $BF_3$, $N_2$, Ar, $PH_3$, $AsH_3$ and $B_2H_6$. A control system provides a continuous flow of the process gas at a constant gas flow rate and constant pressure. Additional information regarding the structure and operation of plasma doping systems is disclosed in U.S. Pat. No. 6,020,592, issued Feb. 1, 2000 to Liebert et al.; U.S. Pat. No. 6,182,604, issued Feb. 6, 2001 to Goeckner et al.; and U.S. Pat. No. 6,335,536, issued Jan. 1, 2002 to Goeckner et al., which are hereby incorporated by reference.

In operation, wafer 120 is positioned on platen 114. The controlled gas source 136 produces the desired pressure and gas flow rate within chamber 110. The pulse source 130 applies a series of pulses to wafer 120, causing formation of a plasma 140 in a plasma discharge region 148 between wafer 120 and anode 124. As known in the art, plasma 140 contains positive ions of the ionizable gas from gas source 136 and includes a plasma sheath in the vicinity, typically at the surface, of wafer 120. The electric field that is present between anode 124 and platen 114 during the pulse accelerates positive ions from plasma 140 across the plasma sheath toward platen 114. The accelerated ions are implanted into wafer 120 to form regions of dopant material. The pulse voltage is selected to implant the positive ions to a desired depth. The number of pulses and the pulse duration are selected to provide a desired dose of dopant material in wafer 120.

As described above, a method for forming a thin film layer on a substrate in accordance with an aspect of the invention includes forming a thin surface layer containing a dopant material on the substrate and short-time thermal processing of the doped surface layer with parameters selected to produce a reaction between the surface layer and the dopant material. Referring to FIG. 2, gas source 136 supplies a gas containing the dopant material to chamber 110. Examples of suitable dopant materials for forming a dielectric layer include, but are not limited to, nitrogen, hafnium and zirconium. Combinations of these and other dopant materials may also be utilized. The gas is ionized in plasma 140 and the ions are implanted into a thin layer on the surface of wafer 120. The thin surface layer may, for example, be a silicon oxide film. The voltage of pulse source 130 is adjusted to implant the ions of the dopant material to a desired depth into the surface layer. The implant energy and the corresponding implant depth are selected to match or nearly match the desired thickness of the thin film layer being produced. The depth is typically in a range of 50 angstroms or less, thus requiring very low energies.

Following formation of the doped surface layer, the short-time thermal processing step is performed. The parameters of the short-time thermal processing step are selected to produce a reaction between the surface layer and the dopant material, while avoiding significant diffusion of the dopant material from the surface layer into the substrate. As used herein, "short-time thermal processing" refers to processes where the doped surface layer is heated to a desired temperature for a time of about 100 milliseconds (ms) or less and more preferably for a time of about 10 ms or less.

In one approach, short-time thermal processing is implemented as a flash RTP process. The flash RTP process involves: (1) rapid heating of the substrate to an intermediate temperature, and (2) while the substrate is heated to the intermediate temperature, very rapid heating of the doped surface layer to a final temperature. The final temperature is higher than the intermediate temperature, and the time duration of the second step is less than the time duration of the first step. By way of example, the first step of the flash RTP process may involve heating the substrate to an intermediate temperature in a range of about 500° C. to 800° C. for a time in a range of about 0.1 to 10 seconds. The second step may involve heating the doped surface layer to a final temperature in a range of about 1000° C. to 1410° C. and more preferably about 1150° C. to 1350° C., for a time in a range of about 0.1 to 100 ms and more preferably for a time in a range of about 0.1 to 10 ms.

Figure 3:
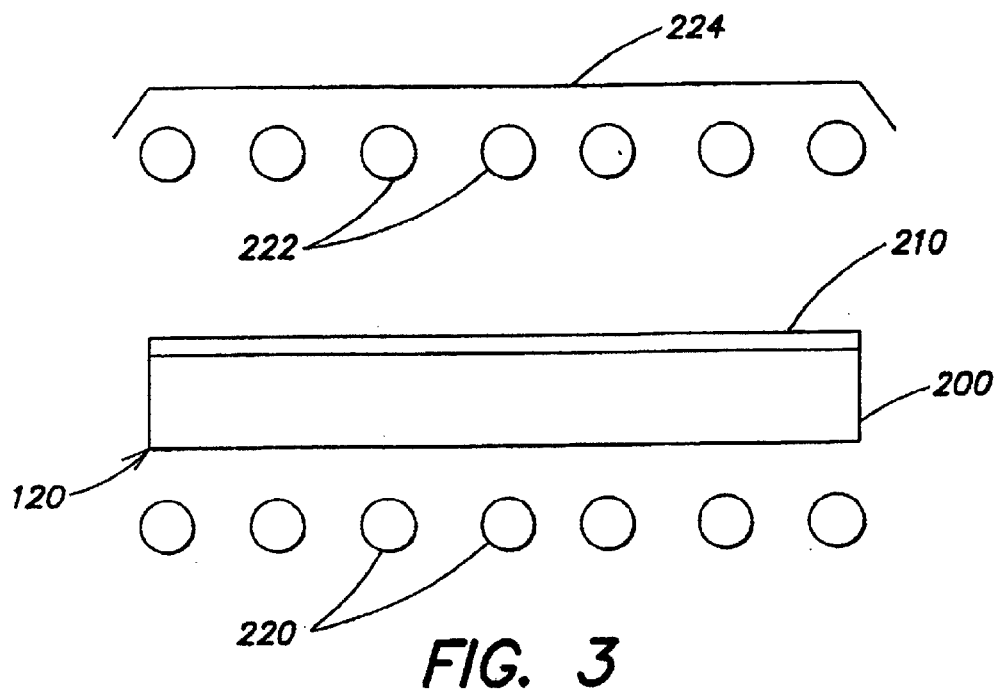
FIG. 3 is a schematic diagram of a flash rapid thermal processing system.

An example of apparatus for performing flash RTP is shown schematically in FIG. 3. Wafer 120 includes substrate 200 and thin surface layer 210 (not shown to scale). Tungsten halogen lamps 220 are positioned in proximity to a side of wafer 120 opposite from surface layer 210. Xenon flash lamps 222 and a reflector 224 are positioned in proximity to wafer 120 on the same side as surface layer 210. During the first step of the RTP process, lamps 220 are energized, and substrate 200 is heated by lamps 220 to an intermediate temperature. Then, when substrate 200 is at the intermediate temperature, flash lamps 222 are energized and an intense pulse of light is applied to surface layer 210, causing a rapid increase to a final temperature. The operation of flash lamps 222 may be on the order of a few milliseconds. The final temperature of surface layer 210 is sufficient to produce a reaction between the dopant material and the surface layer, but the time duration at the final temperature is sufficiently short to avoid significant diffusion of the dopant material from surface layer 210 into substrate 200. The flash RTP process is described, for example, by T. Ito et al. in "Flash Lamp Anneal Technology for Effectively Activating Ion Implanted Si," Extended Abstracts of the 2001 International Conference on Solid-State Devices and Materials, Tokyo, 2001, pages 182–183.

In another embodiment, short-time thermal processing is implemented by irradiating the doped surface layer with laser energy in a process referred to as "sub-melt laser processing," wherein the laser energy parameters are selected to produce the desired reaction between the surface layer and the dopant material without melting of the surface layer or the substrate. The laser energy density used to irradiate the wafer is selected to heat the thin surface layer of the wafer rapidly, preferably in less than about 10 microseconds, to a temperature in the range of about 1100° C. to 1410° C. that does not melt the silicon. The laser energy density is preferably in a range of about 0.50 to 0.58 joules/cm$^2$ at a wavelength of 308 nanometers and a pulse width of 20 nanoseconds. Additional details regarding sub-melt laser processing are disclosed in International Publication No. WO 01/71787, published Sep. 27, 2001, which is hereby incorporated by reference.

Figure 4:
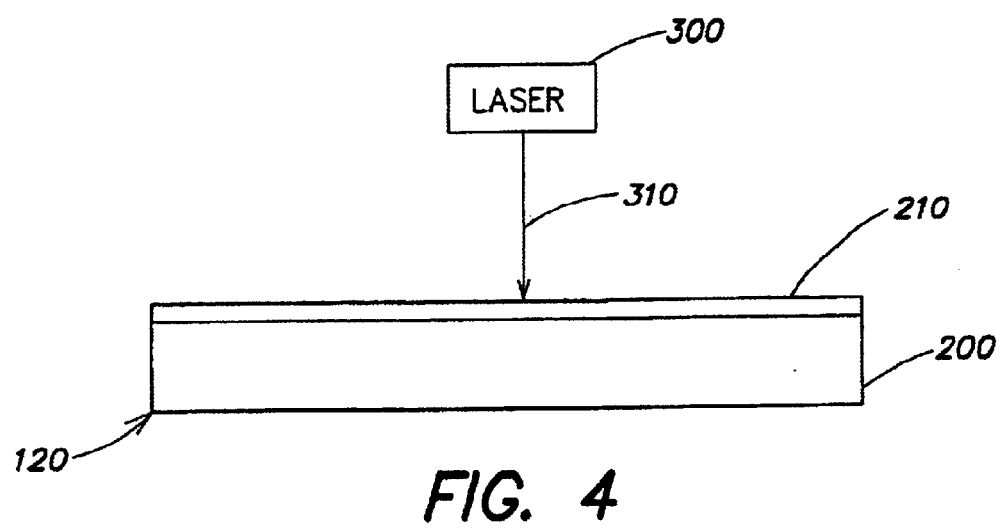
FIG. 4 is a schematic diagram of a sub-melt laser processing system.

A simplified schematic diagram of sub-melt laser processing apparatus is shown in FIG. 4. A laser 300 directs a laser beam 310 at surface layer 210 of wafer 120. The laser beam 310 may be distributed over the surface wafer 120 by scanning of laser beam 310, by mechanical translation of wafer 120 or by a combination of beam scanning and wafer translation. In one embodiment, laser beam 310 has a wavelength of 308 nanometers. One suitable system for performing sub-melt laser annealing is model LA100, available from Verdent Technologies, which may be modified to perform sub-melt laser processing as described herein.

Figure 5:
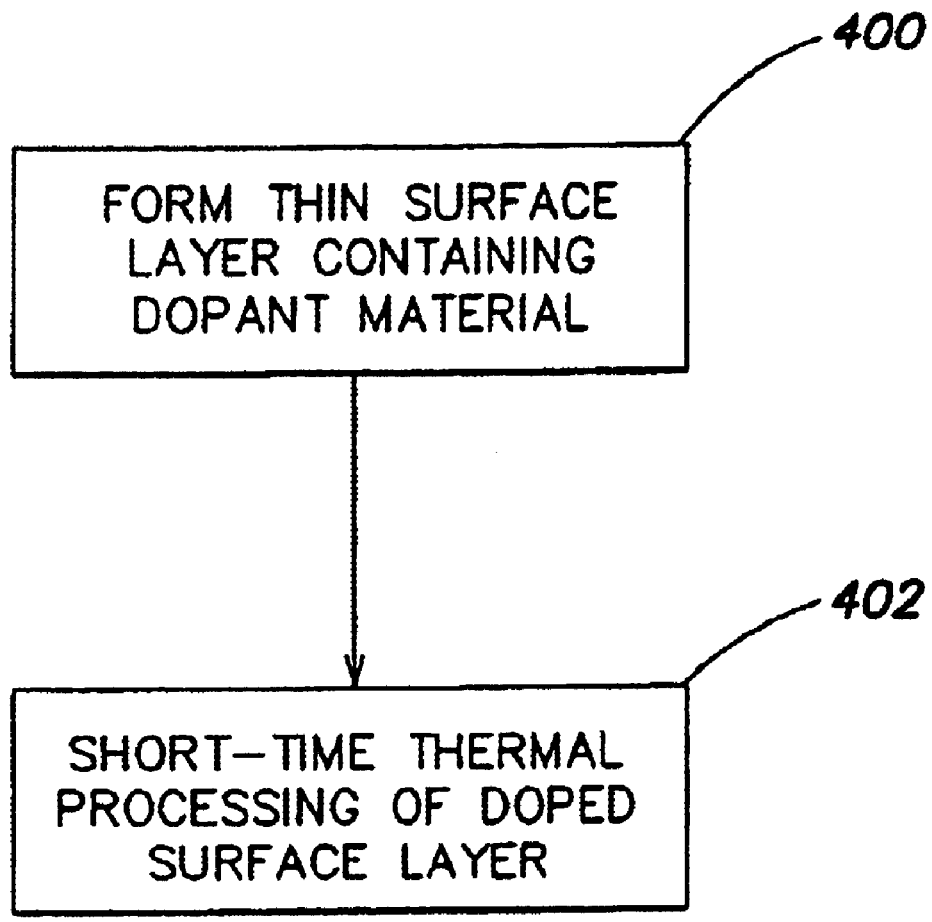
FIG. 5 is a flow diagram of a process for forming thin film layers in accordance with an embodiment of the invention.

A process in accordance with an embodiment of the invention is summarized in the flow diagram of FIG. 5. In step 400, a thin surface layer containing a dopant material is formed on the surface of the substrate. As described above, the doped surface layer may be formed by deposition or oxidation, followed by low energy implantation of the dopant material. Alternatively, the doped surface layer may be formed by chemical vapor deposition or other deposition techniques. In step 402, short-time thermal processing of the doped surface layer is performed. Examples of short-time thermal processing include flash RTP and sub-melt laser processing as described above. The parameters of the short-time thermal processing are selected to produce a reaction between the thin film material and the dopant material, while avoiding significant diffusion of the dopant material beyond the thin film. The reaction produces the desired thin film layer, such as a dielectric layer.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A method for forming a thin film layer on a substrate, comprising the steps of:

forming a thin surface layer containing a dopant material on the substrate; and short-time thermal processing after formation of the doped surface layer with processing parameters selected to produce a reaction between the surface layer and the dopant material while avoiding significant diffusion of the dopant material into the substrate to form a dielectric film, a metal film or a silicide film having a thickness of 50 angstroms or less.

2. A method as defined in claim 1, wherein the step of forming a thin surface layer comprises plasma doping of the thin surface layer with low energy ions of the dopant material.

3. A method as defined in claim 1, wherein the step of forming a thin surface layer comprises ion implantation of the thin surface layer with low energy ions of the dopant material.

4. A method as defined in claim 1, wherein the step of forming a thin surface layer comprises chemical vapor deposition of the thin surface layer and the dopant material.

5. A method as defined in claim 1, wherein the step of forming a thin surface layer comprises doping the thin surface layer with nitrogen.

6. A method as defined in claim 1, wherein the step of forming a thin surface layer comprises doping the thin surface layer with hafnium.

7. A method as defined in claim 1, wherein the step of forming a thin surface layer comprises doping the thin surface layer with zirconium.

8. A method as defined in claim 1, wherein the step of forming a thin surface layer comprises forming a thin silicon oxide film.

9. A method as defined in claim 1, wherein the step of forming a thin surface layer comprises forming a thin surface layer having a thickness of 30 angstroms or less.

10. A method as defined in claim 1, wherein the step of forming a thin surface layer comprises forming a thin surface layer having a thickness of 20 angstroms or less.

11. A method as defined in claim 1, wherein the step of forming a thin surface layer comprises forming a thin silicon oxide layer that is doped with nitrogen.

12. A method as defined in claim 1, wherein the step of short-time thermal processing comprises flash rapid thermal processing of the doped surface layer.

13. A method as defined in claim 1, wherein the step of short-time thermal processing comprises rapid heating of the substrate to an intermediate temperature and flash heating of the doped surface layer to a final temperature that is higher than the intermediate temperature.

14. A method as defined in claim 1, wherein the step of short-time thermal processing comprises sub-melt laser processing of the doped surface layer.

15. A method as defined in claim 1, wherein the step of short-time thermal processing of the doped surface layer comprises heating the doped surface layer to a desired temperature for a time of about 100 milliseconds or less.

16. A method as defined in claim 1, wherein the step of short-time thermal processing of the doped surface layer comprises heating the doped surface layer to a desired temperature for a time of about 10 milliseconds or less.

17. A method as defined in claim 1, wherein the step of short-time thermal processing of the doped surface layer comprises thermal processing at a temperature in a range of about 1000° C. to 1410° C.

18. A method as defined in claim 1, wherein the step of short-time thermal processing of the doped surface layer comprises thermal processing at a temperature in the range of about 1150° C. to 1350° C.

19. A method as defined in claim 1, wherein the reaction between the thin surface layer and the dopant material forms a dielectric layer having a high dielectric constant.

20. A method for forming a thin film layer on a silicon substrate, comprising the steps of:
    forming on the silicon substrate a doped silicon oxide layer containing nitrogen; and
    short-time thermal processing after formation of the doped silicon oxide layer with processing parameters selected to produce a reaction between the silicon oxide and the nitrogen to form silicon nitride, silicon, oxynitride, or both, and to avoid significant diffusion of nitrogen in to the substrate.

21. A method as defined in claim 20, wherein the step of forming a doped silicon oxide layer comprises plasma doping of a thin surface layer with low energy nitrogen ions.

22. A method as defined in claim 20, wherein the step of forming a doped silicon oxide layer comprises ion implantation of a thin surface layer with low energy nitrogen ions.

23. A method as defined in claim 20, wherein the step of forming a doped silicon oxide layer comprises chemical vapor deposition on an oxide layer containing nitrogen.

24. A method as defined in claim 20, wherein the doped silicon oxide layer has a thickness of 50 angstroms or less.

25. A method as defined in claim 20, wherein the step of short-time thermal processing comprises flash rapid thermal processing of the doped silicon oxide layer.

26. A method as defined in claim 20, wherein the step of short-time thermal processing comprises rapid heating of the silicon substrate to an intermediate temperature and flash heating of the doped silicon oxide layer to a final temperature that is higher than the intermediate temperature.

27. A method as defined in claim 20, wherein the step of short-time thermal processing comprises sub-melt laser processing of the doped silicon oxide layer.

28. A method as defined in claim 20, wherein the step of short-time thermal processing of the doped silicon oxide layer comprises heating the doped silicon oxide layer to a desired temperature for a time of about 100 milliseconds or less.

29. A method as defined in claim 20, wherein the step of short-time thermal processing of the doped silicon oxide layer comprises heating the doped silicon oxide layer to a desired temperature for a time of about 10 milliseconds or less.

30. A method as defined in claim 20, wherein the step of short-time thermal processing of the doped silicon oxide layer comprises thermal processing at a temperature in a range of about 1000° C. to 1410° C.

31. A method as defined in claim 20, wherein the step of short-time thermal processing of the doped silicon oxide layer comprises thermal processing at a temperature in a range of about 1150° C. to 1350° C.

* * * * *